US007181716B1

United States Patent
Dahroug

(10) Patent No.: US 7,181,716 B1
(45) Date of Patent: Feb. 20, 2007

(54) METHOD AND APPARATUS FOR GENERATING CIRCUIT MODEL FOR STATIC NOISE ANALYSIS

(75) Inventor: Omar G. Dahroug, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 354 days.

(21) Appl. No.: 10/856,501

(22) Filed: May 28, 2004

(51) Int. Cl.
*G06F 17/50* (2006.01)

(52) U.S. Cl. .................. 716/13; 716/4; 716/6; 716/10

(58) Field of Classification Search ............... 716/1–14
See application file for complete search history.

(56) References Cited

U.S. PATENT DOCUMENTS

| | | | | |
|---|---|---|---|---|
| 6,117,182 | A * | 9/2000 | Alpert et al. .................. | 716/8 |
| 6,253,359 | B1 * | 6/2001 | Cano et al. ..................... | 716/6 |
| 6,493,853 | B1 * | 12/2002 | Savithri et al. ................. | 716/5 |
| 6,499,131 | B1 * | 12/2002 | Savithri et al. ................. | 716/5 |
| 6,615,395 | B1 * | 9/2003 | Hathaway et al. ............. | 716/6 |
| 6,675,118 | B2 * | 1/2004 | Wanek et al. ............... | 702/117 |

OTHER PUBLICATIONS

Vittal et al., Modeling Crosstalk in Resistive VLSI Interconnections, Jan. 1999, pp. 470-475.*

Rajesh Kumar et al., "*Interconnect and Noise Immunity Design for the Pentium® 4 Processor*", Intel Technology Journal Q1, 2001, pp. 1-12.

Rafi Levy et al., "*ClariNet: A Noise Analysis Tool For Deep Submicron Design*", pp. 1-6.

Steven C. Chan et al., "*Practical Considerations in RLCK Crosstalk Analysis For Digital Integrated Circuits*", IEEE, 2001, pp. 598-604.

* cited by examiner

*Primary Examiner*—Jack Chiang
*Assistant Examiner*—Nghia M. Doan
(74) *Attorney, Agent, or Firm*—Gunnison, McKay & Hodgson, L.L.P.; Philip J. McKay

(57) ABSTRACT

A method and apparatus for generating a noise circuit model for an electronic circuit includes analyzing the electronic circuit to determine a first circuit parameter for a victim and aggressor circuits and a second circuit parameter for the aggressor circuits, ordering the aggressor circuits based on their first and second circuit parameters, setting a current model parameter of the circuit model to an initial value, selecting a first aggressor circuit, determining whether to reduce the selected aggressor circuit into a virtual attacker model based on its first circuit parameter, updating the current model parameter in accordance with either the selected aggressor circuit or its virtual attacker model to be inserted, inserting either the selected aggressor circuit or its virtual attacker model to the circuit model, for each aggressor circuit.

7 Claims, 12 Drawing Sheets

```
For (all nets in noise circuit)    {
     total_size += net size
     if (net is aggressor)    {
     if (net strength > top_agg_strength)
     top_aggr_strength = net strength
     if (net size > top_net_size)
     top_net_size = net size
     }
}
```

FIG. 5

| Order | Aggressor |
|---|---|
| 1 | A1 (F1, S1, N1) |
| 2 | A2 (F2, S2, N2) |
| 3 | A2 (F3, S3, N3) |
| ⋮ | ⋮ |
| j | Aj (Fj, Sj, Nj) |
| j+1 | Aj+1 (Fj+1, Sj+1, Nj+1) |
| ⋮ | |

$F_1 < F_2 < \cdots < F_j < F_{j+1} < \cdots$

```
For (each aggressor in sorted list)   {
    If (   (accum_size + aggressor size) > thresh_size)   {
    accum_size++
    insert virtual attacker
    } else {
    accum_size += aggressor size
    insert full aggressor
    }
    }
```

FIG. 8

METHOD AND APPARATUS FOR GENERATING CIRCUIT MODEL FOR STATIC NOISE ANALYSIS

FIELD OF THE INVENTION

The present invention relates to circuit verification. More particularly, the present invention relates to a method and apparatus for generating a circuit model for noise analysis.

BACKGROUND OF THE INVENTION

The size and complexity of integrated circuits (IC) has made conventional circuit simulation methods too computationally expensive to use for circuit verification. For example, conventional circuit reduction methods based on Asymptotic Waveform Evaluation and other algorithms have provided a good accuracy/speed trade-off, and have been used extensively in recent years for timing and noise analysis. However, because of the inherently large size and complexity of the circuit, even these techniques to create circuit models alone are too computationally expensive for analysis of an entire microprocessor.

For noise analysis, component circuits (nets) in a circuit under simulation (referred to as a noise circuit) is classified into two types of nets: victim and aggressor nets. A victim net is a circuit on which noise is injected from one or more surrounding circuits which are capacitively coupled to the victim net. The surrounding circuits affecting the victim net are referred to as its aggressor nets (also referred to as aggressor circuits, or simply aggressors). FIG. 1 schematically illustrates an example of a victim net 10 and two neighboring aggressor nets 12 and 14. For example, switching operations on the aggressor nets may cause a noise pulse onto a signal in the victim net 10, for example, injecting a glitch into the victim net 10 as shown in FIG. 1. It should be noted that a victim net in one noise simulation, in which the noise on the victim net is to be calculated, can be one of the aggressor nets in a different noise simulation to calculate noise effects on another victim net.

A victim net can have hundreds or thousands of aggressor nets. Since the time for analyzing a circuit using reduction methods is roughly proportional to the number of nodes in the circuit cubed i.e., (number of nodes)$^3$, analysis of such a large circuit would require an impracticably long run time. For example, when a victim net is coupled to a clock net, the clock-aggressor can be hundreds of times as large as the victim net. Spending a large amount of execution time analyzing a noise circuit with excessively large aggressor nets does not necessarily increase the accuracy of the analysis. The situation is further exaggerated when the aggressors in question are only weakly coupled to the victim net, and therefore contribute only a small amount of noise.

In reducing the circuit size for noise analysis, there is a fundamental trade-off between analysis "pessimism" (apart from the reality and getting closer to the worst case scenario) and the complexity of the circuit that is used to model noise. That is, simpler models result in shorter run time, but it is typically at the expense of increased pessimism. A conventional method uses a fast and crude analysis to determine aggressor nets that only contribute a small amount of noise to the victim net. Such "weak" aggressor nets are modeled into a simplified form referred to as a "virtual attacker," so as to reduce the size of the noise circuit. These virtual attackers are modeled without resistance, effectively representing the aggressor as a single node which is capacitively coupled to the victim and attached to a voltage source. FIG. 2 schematically illustrates an example including a modeled virtual attacker. In this example, similarly to FIG. 1, the noise circuit includes a victim net 20 and two aggressor nets 22 and 24. The aggressor 22 has been reduced to a simplified virtual capacitive attacker with a voltage source and capacitances. The aggressor 24 remains in its original form.

However, the conventional virtual attacker approach preserves pessimism in the analysis, because the aggressor net is guaranteed to switch as fast as or faster than it would if modeled fully. In addition, the conventional virtual attacker approach only considers the aggressor's effect on noise when selecting virtual attackers. However, there are cases where a victim net is coupled to a large number of small, weakly coupled aggressors, and a few large, strongly coupled aggressors. In such cases, the cumulative noise effect of the many small aggressors may be as great as one of the large aggressors. Furthermore, with respect to the noise circuit size, the full RC model of every small aggressor may contribute less to the noise circuit size than a full RC model of a large aggressor. In these cases the conventional virtual attacker approach will produce a circuit model that is larger than necessary, more pessimistic than necessary, or both.

BRIEF DESCRIPTION OF THE INVENTION

A method and apparatus generate a circuit model for analyzing noise in an electronic circuit which includes a victim circuit and aggressor circuits affecting the victim circuit. The circuit model generation includes (a) analyzing the electronic circuit to determine a first circuit parameter for each of the victim circuit and the aggressor circuits and a second circuit parameter for each of the aggressor circuits, (b) ordering the aggressor circuits based on the first and second circuit parameters thereof, (c) setting a current model parameter of the circuit model to an initial value, (d) selecting a first aggressor circuit in accordance with the ordering, (e) determining whether to reduce the selected aggressor circuit into a virtual attacker model before inserting into the circuit model based on the first circuit parameter thereof, (f) updating the current model parameter in accordance with either the selected aggressor circuit or the virtual attacker model thereof to be inserted, (g) inserting either the selected aggressor circuit or the virtual attacker model thereof to the circuit model in accordance with the determining, (h) selecting a next aggressor circuit based on the ordering, and (g) iteratively repeating the determining, the updating, the inserting, and the selecting a next aggressor circuit.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 5 is a diagram illustrating an example of algorithm which can be used to obtain the total size of the noise circuit, the size of the largest aggressor net, and the strength of the strongest aggressor in accordance with one embodiment of the present invention.

FIG. 8 is a diagram illustrating an example of algorithm which can be used to determine and insert either the selected aggressor or its virtual attacker model into the noise circuit model, in accordance with one embodiment of the present invention.

FIG. 10 is a diagram schematically illustrating

FIG. 11 is a diagram schematically illustrating

DETAILED DESCRIPTION

Figure 1:
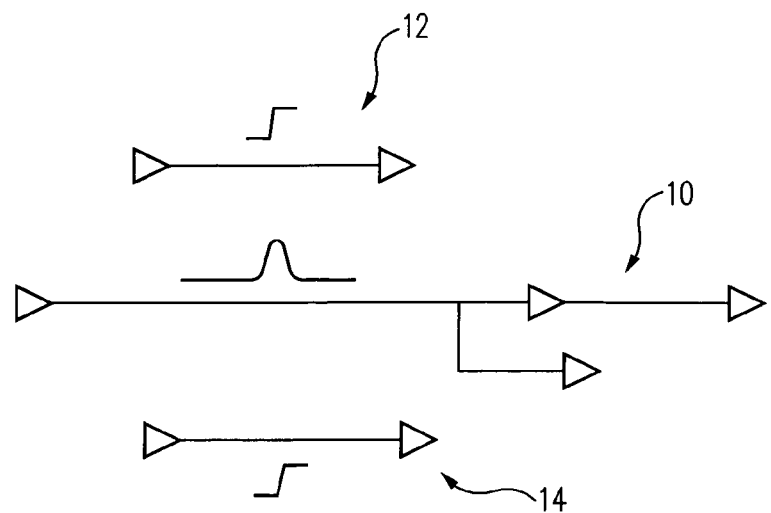
FIG. 1 is a diagram schematically illustrating an example of a victim net and two neighboring aggressor nets in an electronic circuit.
Figure 2:
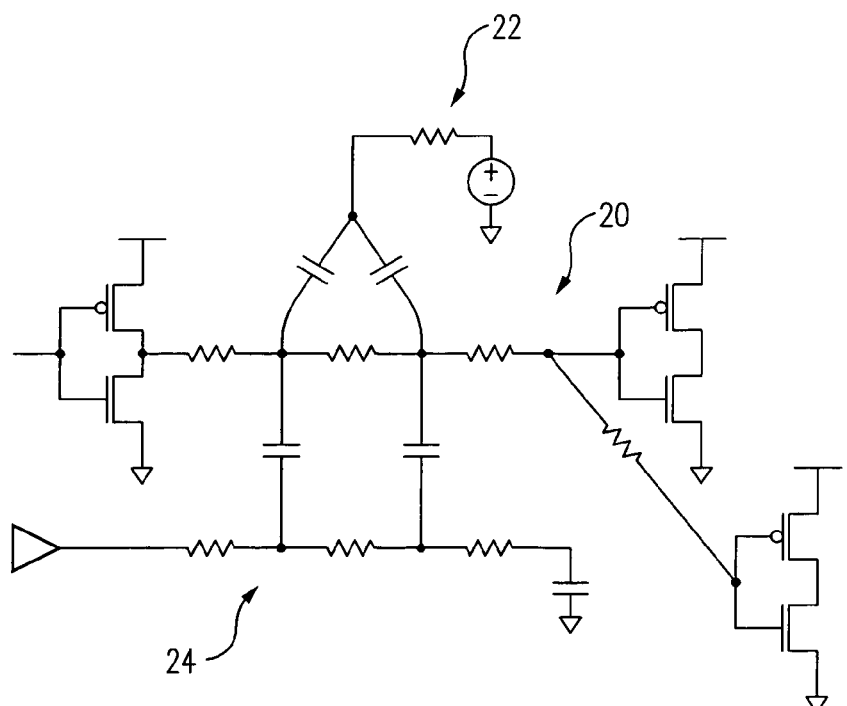
FIG. 2 is an electronic diagram schematically illustrating an example of a victim net, an aggressor net, and a modeled virtual attacker in an electronic circuit.

Embodiments of the present invention are described herein in the context of a method and apparatus for generating a circuit model for static noise analysis. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with one embodiment of the present invention, the components, process steps, and/or data structures may be implemented using various types of operating systems (OS), computing platforms, firmware, computer programs, computer languages, and/or general-purpose machines. The method can be implemented as a programmed process running on processing circuitry. The processing circuitry can take the form of numerous combinations of processors and operating systems, or a stand-alone device. The process can be implemented as instructions executed by such hardware, hardware alone, or any combination thereof. The software may be stored on a program storage device readable by a machine.

In addition, those of ordinary skill in the art will recognize that devices of a less general purpose nature, such as hardwired devices, field programmable logic devices (FPLDs), including field programmable gate arrays (FPGAs) and complex programmable logic devices (CPLDs), application specific integrated circuits (ASICs), or the like, may also be used without departing from the scope and spirit of the inventive concepts disclosed herein.

In accordance with one embodiment of the present invention, the method may be implemented on a data processing computer such as a personal computer, workstation computer, mainframe computer, or high performance server running an OS such as Solaris® available from Sun Microsystems, Inc. of Palo Alto, Calif., Microsoft® Windows® XP and Windows® 2000, available form Microsoft Corporation of Redmond, Wash., or various versions of the Unix operating system such as Linux available from a number of vendors. The method may also be implemented on a multiple-processor system, or in a computing environment including various peripherals such as input devices, output devices, displays, pointing devices, memories, storage devices, media interfaces for transferring data to and from the processor(s), and the like. In addition, such a computer system or computing environment may be networked locally, or over the Internet. In the context of the present invention, the term "network" includes local area networks (LANs), wide area networks (WANs), the Internet, cable television systems, telephone systems, wireless telecommunications systems, fiber optic networks, ATM networks, frame relay networks, satellite communications systems, and the like. Such networks are well known in the art and consequently are not further described here.

Figure 3:
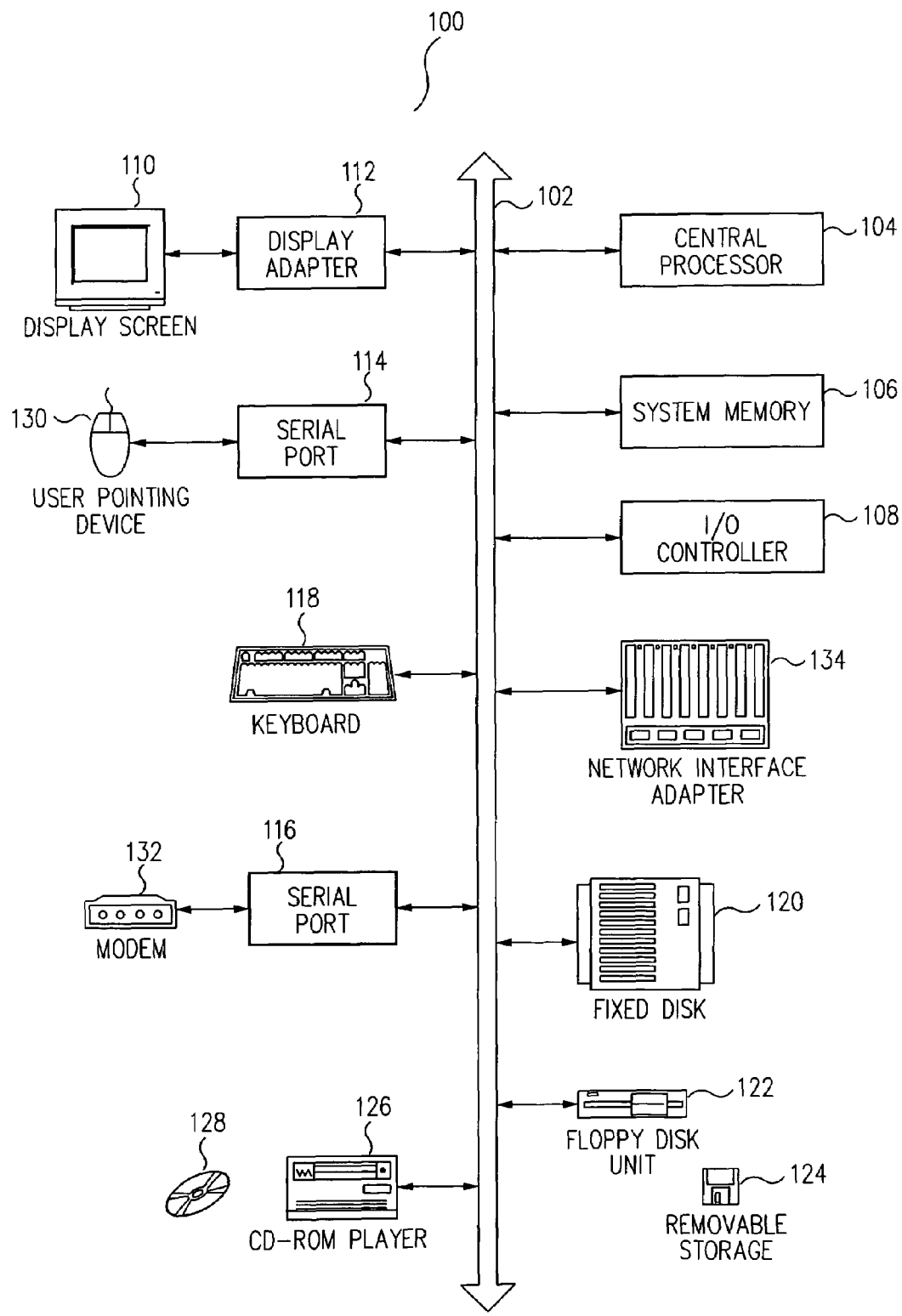
FIG. 3 is a block diagram schematically illustrating a computer system suitable for implementing aspects of the present invention.

FIG. 3 depicts a block diagram of a computer system 100 suitable for implementing aspects of the present invention. As shown in FIG. 3, computer system 100 includes a bus 102 which interconnects major subsystems such as a central processor 104, a system memory 106 (typically RAM), an input/output (I/O) controller 108, an external device such as a display screen 110 via display adapter 112, serial ports 114 and 116, a keyboard 118, a fixed disk drive 120, a floppy disk drive 122 operative to receive a floppy disk 124, and a CD-ROM player 126 operative to receive a CD-ROM 128. Many other devices can be connected, such as a pointing device 130 (e.g., a mouse) connected via serial port 114 and a modem 132 connected via serial port 116. Modem 132 may provide a direct connection to a remote server via a telephone link or to the Internet via a POP (point of presence). Alternatively, a network interface adapter 134 may be used to interface to a local or wide area network using any network interface system known to those skilled in the art (e.g., Ethernet, xDSL, AppleTalk™).

Many other devices or subsystems (not shown) may be connected in a similar manner. Also, it is not necessary for all of the devices shown in FIG. 3 to be present to practice the present invention, as discussed below. Furthermore, the devices and subsystems may be interconnected in different ways from that shown in FIG. 3. The operation of a computer system such as that shown in FIG. 3 is readily known in the art and is not discussed in detail in this application, so as not to overcomplicate the present discussion. Code to implement the present invention may be operably disposed in system memory 106 or stored on storage media such as fixed disk 120, floppy disk 124 or CD-ROM 128.

As described above, the conventional virtual attacker approach only considers one characteristic of the aggressor net when selecting virtual attackers, i.e., the aggressor's effect on noise. However, the cumulative noise effect of a large number of small and weakly-coupled aggressors on a victim net may be as great as that of one of a few large and strongly-coupled aggressors. In addition, since the conventional virtual attacker approach does not take into account each aggressor's contribution to the size of the noise circuit, the resulting noise model can be larger than necessary. Based on these analysis, the Applicant invented a technique for modeling RC circuits for noise analysis that can dramatically reduce noise circuit size and run time, with a minimal increase in analysis pessimism. The modeling process is configurable, such that pessimism can be increased or decreased as desired, resulting in shorter or longer runtime, respectively.

Figure 4A:
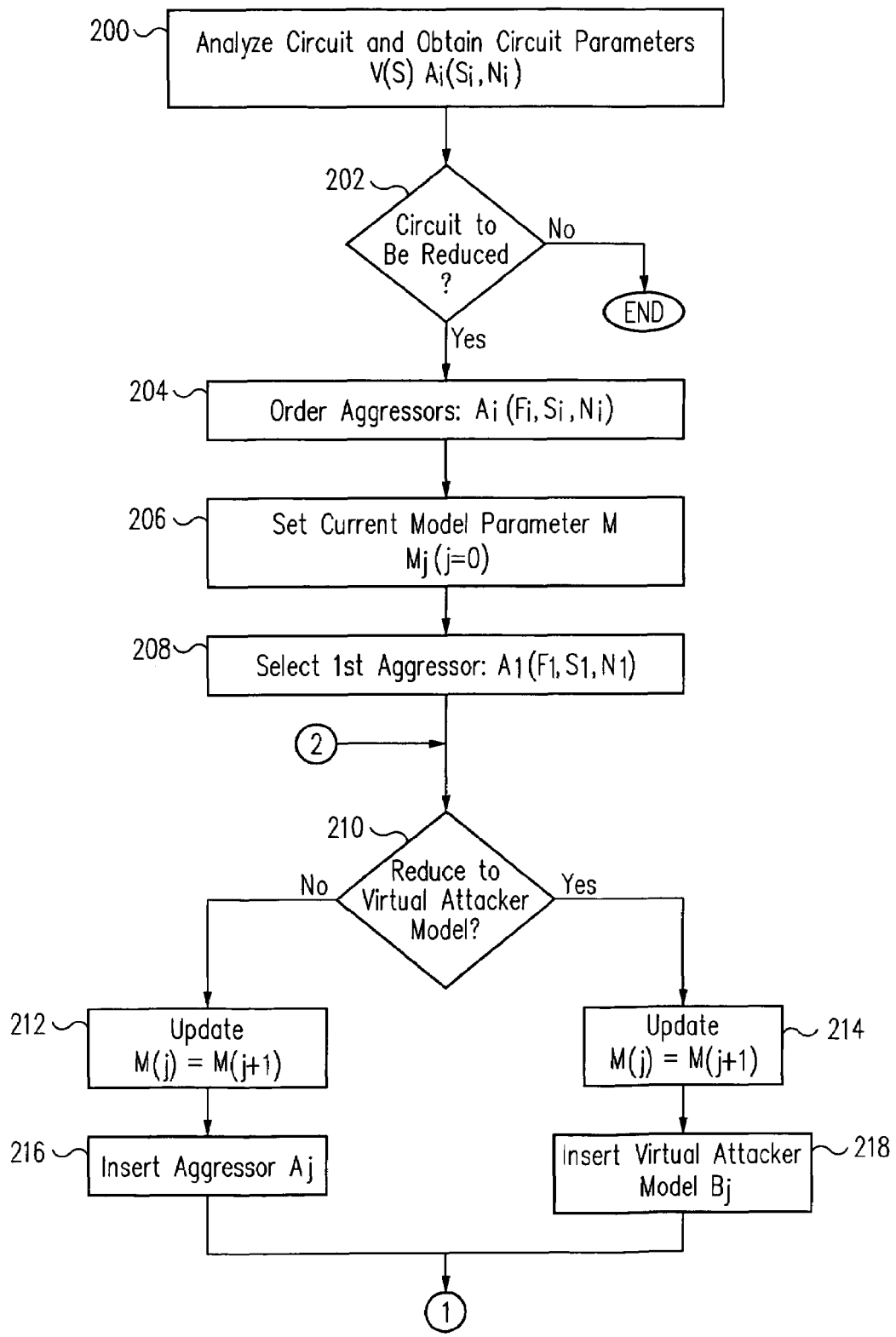
FIGS. 4A–4C are process flow diagrams schematically illustrating a method for generating a circuit model for analyzing noise in an electronic circuit in accordance with one embodiment of the present invention.
Figure 4B:
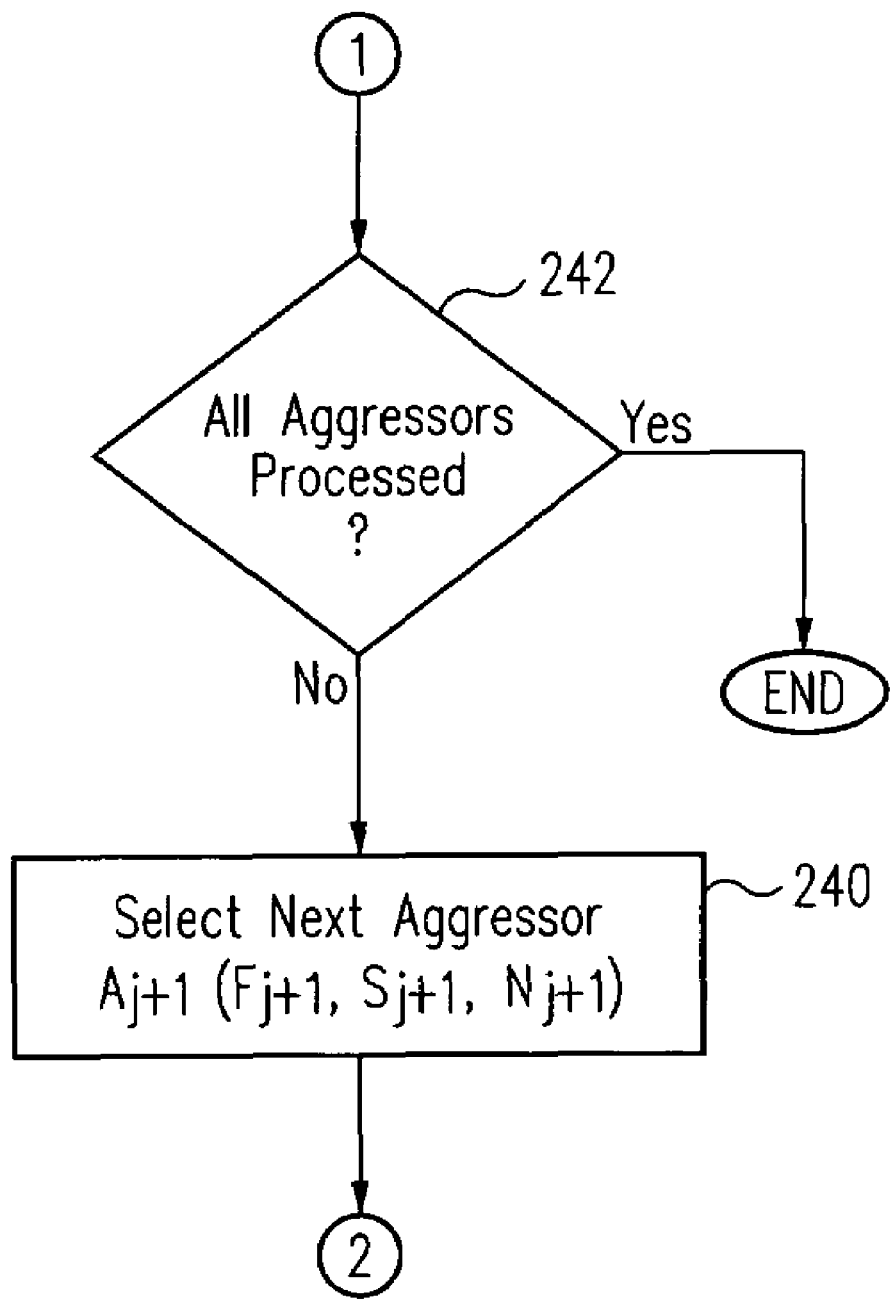
Figure 4C:
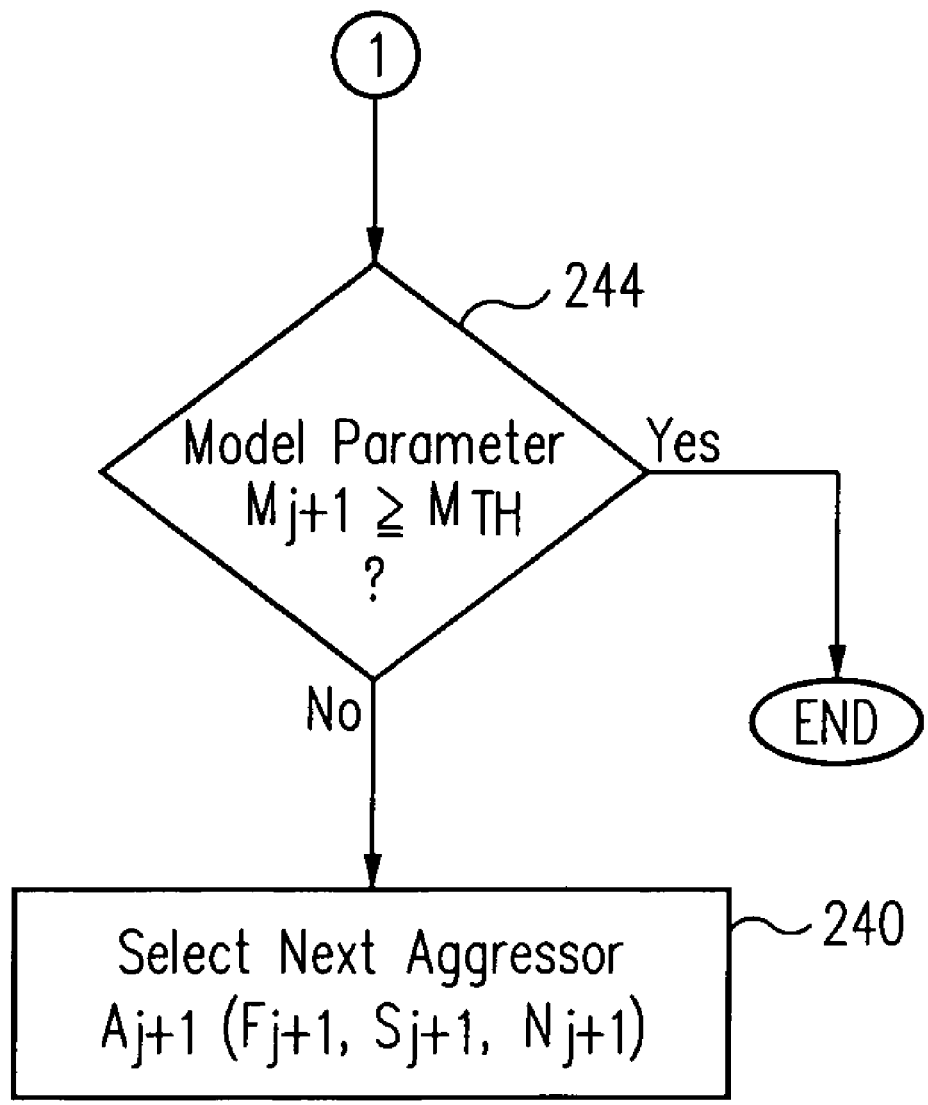

FIGS. 4A–4C schematically illustrate a method for generating a circuit model for analyzing noise in an electronic circuit in accordance with one embodiment of the present invention. The electronic circuit includes a victim circuit (victim net) and aggressor circuits (aggressor nets) affecting the victim circuit, as described above. The electronic circuit under noise analysis (noise circuit) may be represented in an RC netlist. Such a netlist may be in a form of a computer file (sometimes a printed listing) containing a list of the signals in an electronic design and all of the circuit elements (transistors, resistors, capacitors, ICs, etc.) connected to that signal in the design.

As shown in FIG. 4A, First, the noise circuit is analyzed to obtain certain circuit parameters (200). For example, by visiting the victim net (V) and all aggressors nets ($A_i$, i=1, 2, . . . ) in the noise circuit, a first circuit parameter (S) representing the size of the circuit is determined for the victim and all aggressor nets, and a second circuit parameter (N) representing the strength of noise (i.e., the aggressor strength) is determined for all of the aggressor nets. A measure of the total size of the noise circuit, the size of the largest aggressor net, and the strength of the strongest aggressor net may also be obtained. There are a number of ways that the circuit size can be measured, for example, by counting the number of nodes. The aggressor noise strength may reflect an estimated amount of noise injected onto the victim circuit. For example, the total coupling capacitance between the aggressor and the victim net can be used as a measure of the aggressor strength. The aggressor noise strength should be measured with a fast method, so as not to add extra run time before actual noise analysis begins. FIG. 5 illustrates an example of algorithm which can be used to obtain the total size of the noise circuit, the size of the largest aggressor net, and the strength of the strongest aggressor.

Referring back to FIG. 4A, whether to reduce the circuit size may be determined (202) before start modeling the noise circuit. For example, the noise circuit size is less than a predetermined size threshold, no reduction is necessary. Circuits of a size larger than the predetermined size threshold are considered for selection of virtual attackers, i.e., selected aggressors are reduced to a simplified virtual attacker model. Alternatively, the noise circuit can always be reduced to a predetermined fraction of its original size, in which case selection of virtual attackers always occurs. Is also possible to use a hybrid of the two approaches, for example, reducing the noise circuit to a fraction of the total circuit size not to exceed a certain predetermined size threshold.

Figure 6:
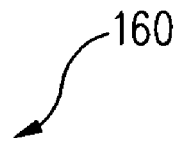
FIG. 6 is a diagram schematically illustrating an example of a list of the sorted aggressors ordered in accordance with the value of their ordering factor, in accordance with one embodiment of the present invention.

Then, the aggressor circuits $A_i$ are ordered based on their first and second circuit parameters $N_i$ and $S_i$ (204). For example, a numerical ordering factor ($F_i$) may be assigned to each aggressor $A_i$ based on the first and second circuit parameters, and the aggressors may be ordered in accordance with the value of their ordering factors. For example, the ordering factor Fi may be calculated as a function of the first circuit parameter and the second circuit parameter (i.e., $F_i=f(S_i, N_i)$). In accordance with one embodiment of the present invention, the ordering factor $F_i$ of each aggressor circuit Ai is expressed as:

$$F_i(S_i, N_i)=S_i/S_{MAX}+(N_{MAX}-N_i)/N_{MAX},$$

where the first circuit parameter $S_i$ represents the size of the aggressor, the second circuit parameter $N_i$ represents the noise strength of the aggressor, $S_{MAX}$ represents the size of the largest aggressor circuit, and $N_{MAX}$ represents the noise strength of the strongest aggressor circuit. Then, the aggressors are sorted by the ordering factor $F_i$ such that the aggressor with the lowest factor value is the first, and then arranged in the increasing order of the factor values. FIG. 6 schematically illustrates an example of a list 160 of the sorted aggressors which are ordered in accordance with the value of their ordering factors. Such a list may be stored to select and process the aggressor circuits in the sorted order.

The formula of the ordering factor is by way of example and is not intended to be exhaustive or limiting in any way. Other formulas for computing the ordering factor can be used. However, the ordering factors should be assigned such that the aggressors with a smaller size and greater strength are considered and processed first, compared with weak aggressors of a lager size. In addition, in accordance with specific applications, the size effect part ($S_i/S_{MAX}$) and the noise effect part (($N_{MAX}-N_i)/N_{MAX}$) can be weighted, for example, by adding a different weight, to change the trade-off between the simplicity and the pessimism.

Referring back to FIG. 4A, a current model parameter ($M_j$) is set to an initial value ($M_0=M_j(j=0)$) (206). The current model parameter represents a current circuit size of the noise circuit model. The initial value may be the victim net size ($S_0$), since at this point, the noise circuit model only includes the victim net.

Then, a first aggressor is selected (208) in accordance with the ordering. For example, aggressor $A_1$ having the smallest ordering factor $F_1$ is selected first. Whether to reduce the selected aggressor circuit into a corresponding virtual attacker model ($B_1$) is determined (210). The current model parameter is updated (212, 214) in accordance with either the selected aggressor circuit or its virtual attacker model to be inserted. Then either the selected aggressor circuit (216) or its virtual attacker model (218) is inserted into the circuit model in accordance with the determination.

Figure 7:
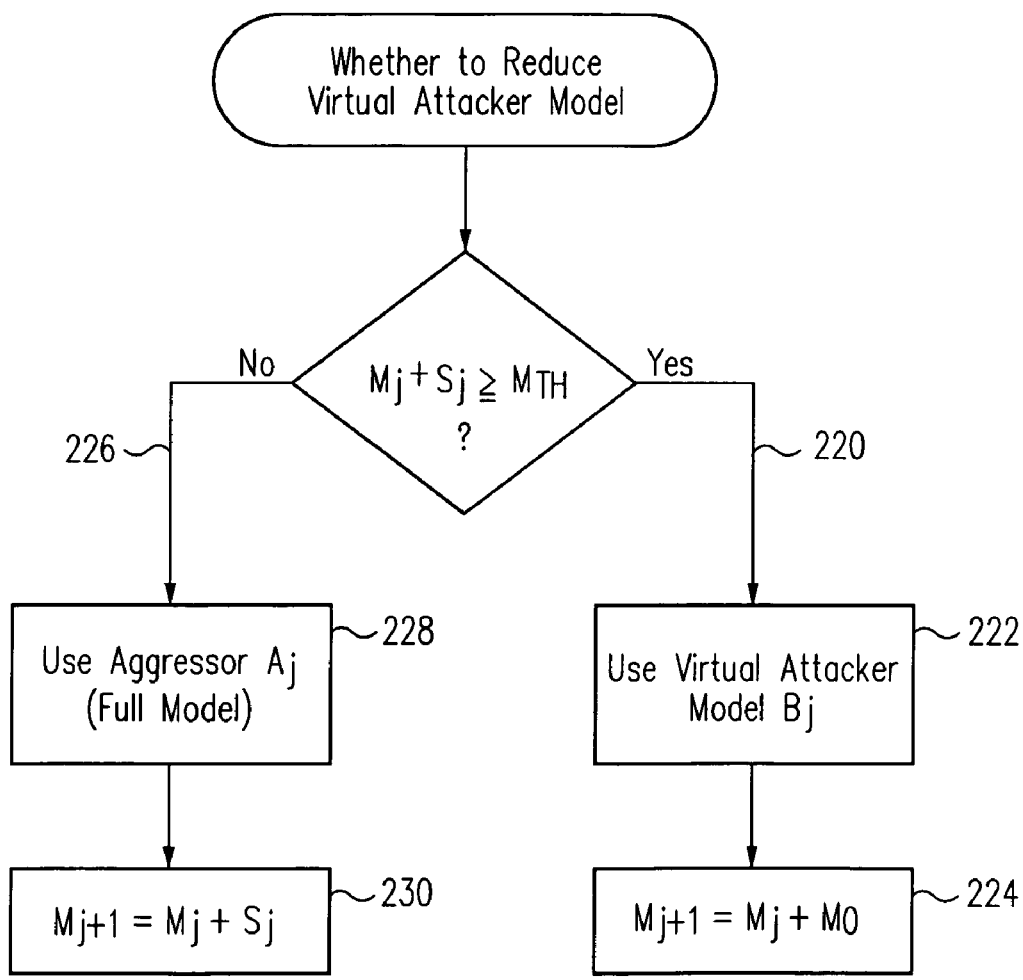
FIG. 7 is a process flow diagram schematically illustrating an example of the process 210 through 218 in FIG. 4A for a selected aggressor circuit, in accordance with one embodiment of the present invention.

FIG. 7 schematically illustrates an example of the process 210 through 218 described above for a selected aggressor circuit $A_j$ in accordance with one embodiment of the present invention. As shown in FIG. 7, if the current model parameter $M_j$ (current noise circuit size) plus the first parameter $S_j$ (the aggressor size) exceeds a predetermined threshold size $M_{TH}$ (220), the selected aggressor circuit is determined to be reduced to a virtual attacker model (222). The current model parameter ($M_j$) is incremented by a predetermined value associated with the virtual aggressor model to an updated value ($M_{j+1}$) (224). This predetermined value may be a unit value of the first parameter (the circuit size), for example, count one for the node number. If the current model parameter $M_j$ plus the first parameter $S_j$ does not exceeds the predetermined threshold size $M_{TH}$ (226), the selected aggressor circuit $A_j$ is inserted as is, or with its full circuit model, to the noise circuit model (228). The current model parameter ($M_j$) is incremented by the vale of the first circuit parameter ($S_j$), i.e., the size of the selected aggressor circuit $A_j$, to an updated model parameter value ($M_{j+1}$) (230). The predetermined threshold size $M_{TH}$ may be either a predetermined noise model size, a fixed node number, or a fraction of the original size of the noise circuit. FIG. 8 illustrates an example of algorithm which can be used to determine and insert either the selected aggressor or its virtual attacker model into the noise circuit model.

Then, as shown in FIG. 4B, a next aggressor is selected in accordance with the ordering (240), and the above-described process steps are iteratively repeated until all of the aggressor circuits in the electronic circuit are processed (242). Alternatively, as shown in FIG. 4C, the processing of the aggressor circuit may be repeated until the current model parameter $M_j$ reaches a predetermined value $M_{END}$ (244). The predetermined value $M_{END}$ may be the same as or greater than the threshold value $M_{TH}$. As shown in FIGS. 4B and 4C, the circuit model is used for a simulation to produce a predicted noise on the victim circuit.

Figure 9:
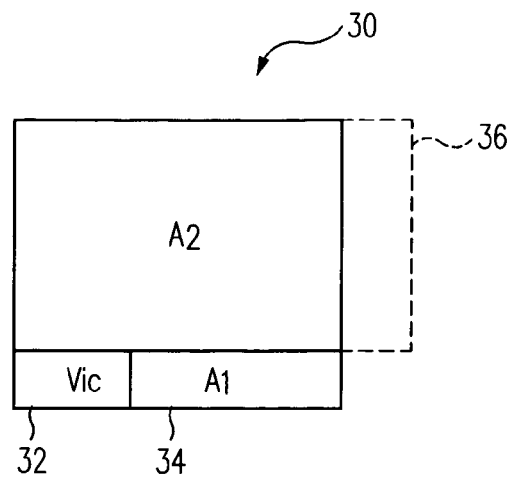
FIGS. 9–11 are a diagram schematically and conceptually illustrating the process of inserting the aggressor circuits or their virtual attacker models into the noise circuit model, in accordance with one embodiment of the present invention.
Figure 10:
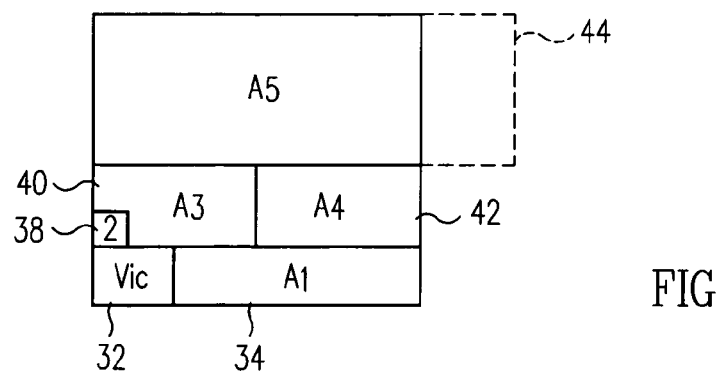
Figure 11:
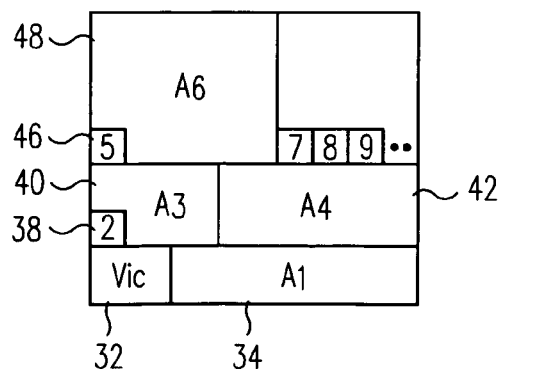
Figure 12:
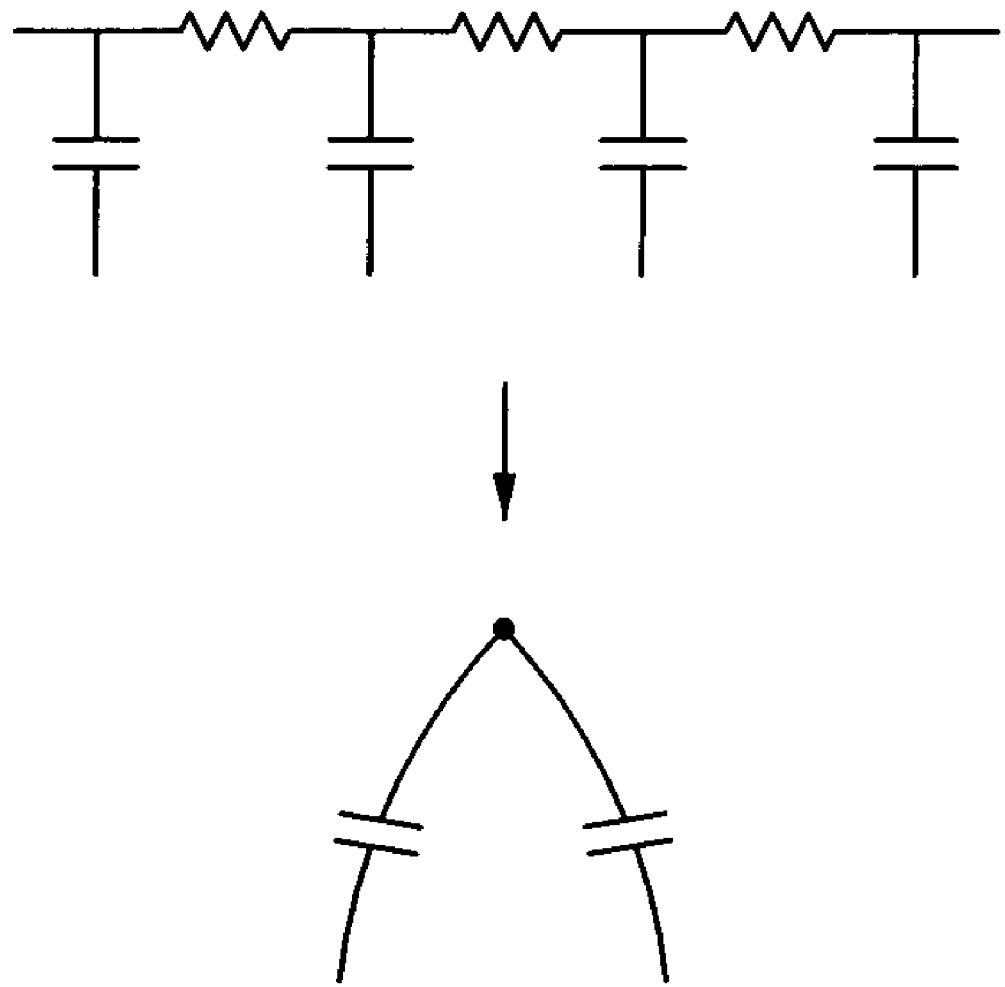
FIG. 12 is a diagram schematically illustrating an example of modeling an aggressor net into a single-node capacitively coupled to the victim circuit.

FIGS. 9–11 schematically and conceptually illustrates the above described process of inserting the aggressor circuits or their virtual attacker models into the noise circuit model 30. In these figures, the area corresponds to the size of the circuit or circuit model. The solid outer line of the rectangular represents the predetermined threshold value of the model parameter $M_{TH}$. In FIG. 9, the victim net Vic 32 and the first aggressor $A_1$ (full model) 34 have been inserted in the noise circuit model 30. The second aggressor $A_2$ 36 has a circuit size which exceeds the "remaining room" in the circuit model 30. That is, the current circuit model size (i.e., Vic and $A_1$) plus the second aggressor size exceeds the predetermined threshold size of the noise circuit model 30. Thus, as shown in FIG. 10, the second aggressor $A_2$ is reduced to a virtual attacker model 38, and inserted into the noise circuit model 30. For example, As shown in FIG. 12, the aggressor may be modeled into a single-node capacitively coupled to the victim. Referring back to FIG. 10, the third and fourth aggressors $A_3$ and $A_4$ 40 and 42, which fit within the remaining size space are inserted to the noise circuit model 30. without being reduced to a corresponding virtual attacker. The size of the fifth aggressor $A_5$ 44, however, exceeds the remaining model size space. Thus, as shown in FIG. 11, a virtual attacker model of the fifth aggressor is inserted in the noise circuit model. The process continues in a similar manner until all of the aggressors are processed or the size space becomes full, as described above.

In choosing aggressors to be modeled as virtual attackers, the embodiments of the present invention (referred to as Simple Adaptive Circuit Model: SACM) will favor larger nets over smaller nets, and weakly coupled nets over strongly coupled nets. In this way, the SACM fulfills the goal of producing small noise circuit models with the minimal amount of pessimism. Although the SACM uses simple heuristics instead of more sophisticated techniques such as realizable reduction methods, it is very computationally efficient, and in practice this method adds no significant run time to the process of noise analysis. The SACM considers both the size of the aggressor net and its effect on the noise in the victim. Using these two criteria, the SACM is able to select a combination of aggressors to model as virtual attackers, which produces a better runtime/pessimism trade-off than the conventional virtual attacker approach. In addition, by changing the formula of the ordering factor, the respective weight of size and noise strength can be changed in accordance with the electronic circuit to be analyzed or other specific desirability or necessity.

Figure 13:
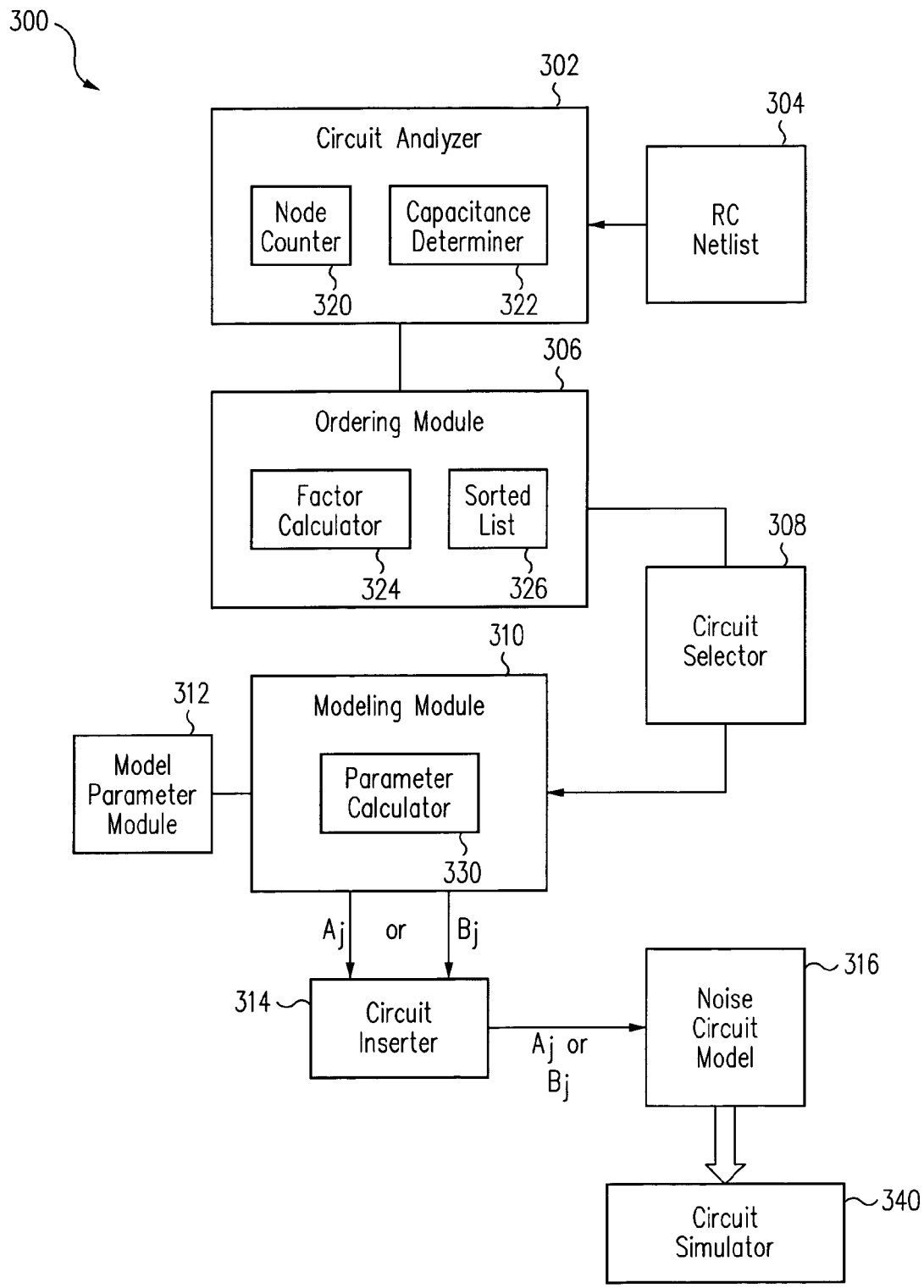
FIG. 13 is a block diagram schematically illustrating an apparatus for generating a circuit model for analyzing noise in an electronic circuit in accordance with one embodiment of the present invention.

FIG. 13 schematically illustrates an apparatus 300 for generating a circuit model for analyzing noise in an electronic circuit in accordance with one embodiment of the present invention. As shown in FIG. 13, the apparatus includes a circuit analyzer 302, an ordering module 306 coupled to the circuit analyzer 302, a circuit selector 308 coupled to the ordering module 306, a modeling module 310 coupled to the circuit selector 306, a model parameter module 312 coupled to the modeling module 310, and a circuit inserter 314 coupled to the modeling module 310. An RC netlist 304 of the electronic circuit includes a victim circuit (victim net) and aggressor circuits (aggressor nets) affecting the victim circuit, as descried above. The RC netlist 304 may be contained in a database or memory coupled to the circuit analyzer 302.

The circuit analyzer 302 is adapted to analyze the electronic circuit to determine a first circuit parameter (such as the circuit size) for each of the victim circuit and the aggressor circuits, and a second circuit parameter (such as noise strength) for each of the aggressor circuits. For example, the circuit analyzer 302 may include a node counter 320 adapted to count a number of nodes of each of the victim and aggressor circuits, which represents the size of the circuit. In addition, the circuit analyzer 302 may also include a capacitance determiner 322 adapted to determine a total coupling capacitance between the aggressor circuit and the victim circuit, which represents the noise strength of the aggressor circuit. In addition, the circuit analyzer 302 may further calculate a sum of the first circuit parameters (size or the number of nodes) of the victim circuit and the aggressor circuits to obtain the total size of the electronic circuit, and determine whether to reduce a model circuit size of the electronic circuit for noise analysis based on the total size.

The ordering module 306 is adapted to order the aggressor circuits based on their first and second circuit parameters. The ordering module 306 may include a factor calculator 324 adapted to calculate an ordering factor for each aggressor circuit. The ordering factor may be a function of the first and second circuit parameters. For example, if the first circuit parameter represents a size of the circuit and the second circuit parameter represents a noise strength of the circuit, the ordering factor of each aggressor circuit may be expressed as: $F(S,N)=S/S_{MAX}+(N_{MAX}-N_i)/N_{MAX}$, where S is the size of the aggressor circuit, N is the noise strength of the aggressor circuit, $S_{MAX}$ is the size of the largest aggressor circuit, and $N_{MAX}$ is the noise strength of the strongest aggressor circuit. The ordering module 306 sorts the aggressor circuits in accordance with their ordering factor, and may create a sorted list 326, for example, such as the list 160 shown in FIG. 6. The sorted list may be used by the circuit selector 308 when it selects the aggressors for the modeling module 310.

The circuit selector 308 is adapted to iteratively select an aggressor circuit in accordance with the sorted order. The circuit selector 308 may iteratively select all of the aggressor circuits in the electronic circuit, or alternatively, until the current model parameter reaches a first predetermined value.

The modeling module 310 is adapted to determine whether the selected aggressor circuit is to be reduced into a virtual attacker model based on the first parameter of the selected aggressor circuit and a current model parameter for the circuit model. The modeling module 310 may include a parameter calculator 330 which determines if the current model parameter plus the first circuit parameter exceeds a first predetermined value for the current model parameter.

The model parameter module 312 is adapted to update the current model parameter based on the selected aggressor circuit or its virtual attacker model to be inserted to the circuit model. The model parameter module 312 may be integrated into the modeling module 310. The model parameter module may set an initial value of the current model parameter to the first circuit parameter of the victim circuit. The model parameter module 310 may include a first incrementor operative when the selected aggressor circuit is to be inserted, for incrementing the current model parameter by the first circuit parameter of the selected aggressor circuit, and a second incrementor operative when the virtual aggressor model of the selected aggressor circuit is to be inserted, for incrementing the current model parameter by a second predetermined value associated with the virtual aggressor model. This second predetermined value may be a unit value of the first circuit parameter, for example, the unit circuit size, or count one (1) in the number of nodes.

The circuit inserter 314 is adapted to insert either the selected aggressor circuit or its virtual attacker model to the circuit model 316 based on the determination by the modeling module 310. The circuit inserter 314 may include a first inserter operative when the current model parameter plus the first circuit parameter does not exceed a first predetermined value for the current model parameter, for inserting the selected aggressor circuit into the circuit model, and a second inserter operative when the current model parameter plus the first circuit parameter exceeds a first predetermined value for the current model parameter, for inserting the virtual aggressor model of the selected aggressor circuit into the circuit model. The circuit model 316 may be maintained or stored in a memory coupled to the circuit inserter 314. The resulting circuit model 316 is simulated, for example, by a noise simulator 340 to produce a predicted noise pulse on the victim circuit.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

The invention claimed is:

1. A method for generating a circuit model for analyzing noise in an electronic circuit, the electronic circuit including a victim circuit and aggressor circuits affecting the victim circuit, said method comprising:

analyzing the electronic circuit to determine a first circuit parameter for each of the victim circuit and the aggressor circuits and a second circuit parameter for each of the aggressor circuits;

ordering the aggressor circuits based on the first and second circuit parameters thereof;

setting a current model parameter of the circuit model to an initial value;

selecting a first aggressor circuit in accordance with said ordering;

determining whether to reduce the selected aggressor circuit into a virtual attacker model before inserting into the circuit model based on the first circuit parameter thereof;

updating the current model parameter in accordance with either the selected aggressor circuit or the virtual attacker model thereof to be inserted;

inserting either the selected aggressor circuit or the virtual attacker model thereof to the circuit model in accordance with said determining;

selecting a next aggressor circuit based on said ordering; and iteratively repeating said determining, said updating, said inserting, and said selecting a next aggressor circuit;

wherein said ordering comprises:

calculating an ordering factor for each aggressor circuit, the ordering factor being a function of the first circuit parameter and the second circuit parameter, further wherein the first circuit parameter represents a size of the circuit and the second circuit parameter represents a noise strength of the circuit, the ordering factor of each aggressor circuit being expressed as:

$$F(S,N)=S/S_{MAX}+(N_{MAX}-N)/N_{MAX},$$

where S is the size of the aggressor circuit, N is the noise strength of the aggressor circuit, $S_{MAX}$ is the size of the largest aggressor circuit, and $N_{MAX}$ is the noise strength of the strongest aggressor circuit.

2. An apparatus for generating a circuit model for analyzing noise in an electronic circuit, said apparatus comprising:

an analyzer adapted to receive an RC netlist of the electronic circuit, the electronic circuit including a victim circuit and aggressor circuits affecting the victim circuit, said analyzer being adapted to analyze the electronic circuit to determine a first circuit parameter for each of the victim circuit and the aggressor circuits and a second circuit parameter for each of the aggressor circuits;

an ordering module coupled to said analyzer, adapted to order the aggressor circuits based on the first and second circuit parameters thereof;

a circuit selector coupled to said ordering module, adapted to iteratively select an aggressor circuit in accordance with the sorted order;

a modeling module coupled to said circuit selector, adapted to determine whether the selected aggressor circuit is to be reduced into a virtual attacker model based on the first parameter of the selected aggressor circuit and a current model parameter for the circuit model;

a model parameter module coupled to said modeling module, adapted to update the current model parameter based on the selected aggressor circuit or the virtual attacker model thereof to be inserted to the circuit model; and a circuit inserter coupled to said modeling module, adapted to insert either the selected aggressor circuit or the virtual attacker model thereof to the circuit model based on the determination by said modeling module, wherein;

said ordering module comprises:

a factor calculator adapted to calculate an ordering factor for each aggressor circuit, the ordering factor being a function of the first and second circuit parameters, further wherein the first circuit parameter represents a size of the circuit and the second circuit parameter represents a noise strength of the circuit, the ordering factor of each aggressor circuit being expressed as:

$$F(S,N)=S/S_{MAX}+(N_{MAX}-N)/N_{MAX},$$

where S is the size of the aggressor circuit, N is the noise strength of the aggressor circuit, $S_{MAX}$ is the size of the largest aggressor circuit, and $N_{MAX}$ is the noise strength of the strongest aggressor circuit.

3. A method for generating a circuit model for analyzing noise in an electronic circuit, the electronic circuit including a victim circuit and aggressor circuits affecting the victim circuit, said method comprising:

analyzing the electronic circuit to determine a size of each of the victim circuit and the aggressor circuits and a noise strength of each of the aggressor circuits, the noise strength reflecting an estimated amount of noise injected onto the victim circuit;

assigning an ordering factor to each of the aggressor circuits, the ordering factor being a function of the size and the noise strength of the aggressor circuit, a larger size increasing the ordering factor and a greater noise strength decreasing the ordering factor;

ordering the aggressor circuits in an order of increasing ordering factors;

setting a current model size of the circuit model to a size of the victim circuit;

selecting a first aggressor circuit in accordance with the order;

determining if a sum of the current model size and the size of the selected aggressor circuit exceeds a predetermined size;

incrementing the current model size by the size of the selected aggressor circuit if the sum does not exceed the predetermined size, and inserting the selected aggressor circuit into the circuit model;

incrementing the current model size by a unit size if the sum exceeds the predetermined size, and inserting a virtual attacker model of the selected aggressor circuit into the circuit model;

selecting a next aggressor circuit based on said ordering; and iteratively repeating said determining, said incrementing and inserting, and said selecting a next aggressor circuit.

4. An apparatus for generating a circuit model for analyzing noise in an electronic circuit, the electronic circuit including a victim circuit and aggressor circuits affecting the victim circuit, said apparatus comprising:

means for analyzing the electronic circuit to determine a first circuit parameter for each of the victim circuit and the aggressor circuits and a second circuit parameter for each of the aggressor circuits;

means for ordering the aggressor circuits based on the first and second circuit parameters thereof;

means for setting a current model parameter of the circuit model to an initial value;

means for selecting a first aggressor circuit in accordance with said ordering;

means for determining whether to reduce the selected aggressor circuit into a virtual attacker model before inserting into the circuit model based on the first circuit parameter thereof;

means for updating the current model parameter in accordance with either the selected aggressor circuit or the virtual attacker model thereof to be inserted;

means for inserting either the selected aggressor circuit or the virtual attacker model thereof to the circuit model in accordance with said determining;

means for selecting a next aggressor circuit based on said ordering; and means for iteratively repeating said determining, said updating, said inserting, and said selecting a next aggressor circuit, wherein;

said means for ordering comprises:

means for calculating an ordering factor for each aggressor circuit, the ordering factor being a function of the first circuit parameter and the second circuit parameter, further wherein the first circuit parameter represents a size of the circuit and the second circuit parameter represents a noise strength of the circuit, the ordering factor of each aggressor circuit being expressed as:

$$F(S,N)=S/S_{MAX}+(N_{MAX}-N)/N_{MAX},$$

where S is the size of the aggressor circuit, N is the noise strength of the aggressor circuit, $S_{MAX}$ is the size of the largest aggressor circuit, and $N_{MAX}$ is the noise strength of the strongest aggressor circuit.

5. An apparatus for generating a circuit model for analyzing noise in an electronic circuit, the electronic circuit including a victim circuit and aggressor circuits affecting the victim circuit, said apparatus comprising:

means for analyzing the electronic circuit to determine a size of each of the victim circuit and the aggressor circuits and a noise strength of each of the aggressor circuits, the noise strength reflecting an estimated amount of noise injected onto the victim circuit;

means for assigning an ordering factor to each of the aggressor circuits, the ordering factor being a function of the size and the noise strength of the aggressor circuit, a larger size increasing the ordering factor and a greater noise strength decreasing the ordering factor;

means for ordering the aggressor circuits in an order of increasing ordering factors;

means for setting a current model size of the circuit model to a size of the victim circuit;

means for selecting a first aggressor circuit in accordance with the order;

means for determining if a sum of the current model size and the size of the selected aggressor circuit exceeds a predetermined size;

means for incrementing the current model size by the size of the selected aggressor circuit if the sum does not exceed the predetermined size, and inserting the selected aggressor circuit into the circuit model;

means for incrementing the current model size by a unit size if the sum exceeds the predetermined size, and inserting a virtual attacker model of the selected aggressor circuit into the circuit model;

means for selecting a next aggressor circuit based on said ordering; and means for iteratively repeating said determining, said incrementing and inserting, and said selecting a next aggressor circuit.

6. A program storage device readable by a machine, tangibly embodying a program of instructions executable by the machine to perform a method for generating a circuit model for analyzing noise in an electronic circuit, the electronic circuit including a victim circuit and aggressor circuits affecting the victim circuit, said method comprising:

analyzing the electronic circuit to determine a first circuit parameter for each of the victim circuit and the aggressor circuits and a second circuit parameter for each of the aggressor circuits;

ordering the aggressor circuits based on the first and second circuit parameters thereof;

setting a current model parameter of the circuit model to an initial value;

selecting a first aggressor circuit in accordance with said ordering;

determining whether to reduce the selected aggressor circuit into a virtual attacker model before inserting into the circuit model based on the first circuit parameter thereof;

updating the current model parameter in accordance with either the selected aggressor circuit or the virtual attacker model thereof to be inserted;

inserting either the selected aggressor circuit or the virtual attacker model thereof to the circuit model in accordance with said determining;

selecting a next aggressor circuit based on said ordering; and iteratively repeating said determining, said updating, said inserting, and said selecting a next aggressor circuit, wherein;

said ordering comprises:

calculating an ordering factor for each aggressor circuit, the ordering factor being a function of the first circuit parameter and the second circuit parameter, further wherein the first circuit parameter represents a size of the circuit and the second circuit parameter represents a noise strength of the circuit, the ordering factor of each aggressor circuit being expressed as:

$$F(S,N)=S/S_{MAX}+(N_{MAX}-N)/N_{MAX},$$

where S is the size of the aggressor circuit, N is the noise strength of the aggressor circuit, $S_{MAX}$ is the size of the largest aggressor circuit, and $N_{MAX}$ is the noise strength of the strongest aggressor circuit.

7. A program storage device readable by a machine, tangibly embodying a program of instructions executable by the machine to perform a method for generating a circuit model for analyzing noise in an electronic circuit, the electronic circuit including a victim circuit and aggressor circuits affecting the victim circuit, said method comprising:

analyzing the electronic circuit to determine a size of each of the victim circuit and the aggressor circuits and a noise strength of each of the aggressor circuits, the noise strength reflecting an estimated amount of noise injected onto the victim circuit;

assigning an ordering factor to each of the aggressor circuits, the ordering factor being a function of the size and the noise strength of the aggressor circuit, a larger size increasing the ordering factor and a greater noise strength decreasing the ordering factor;

ordering the aggressor circuits in an order of increasing ordering factors;

setting a current model size of the circuit model to a size of the victim circuit;

selecting a first aggressor circuit in accordance with the order;

determining if a sum of the current model size and the size of the selected aggressor circuit exceeds a predetermined size;

incrementing the current model size by the size of the selected aggressor circuit if the sum does not exceed the predetermined size, and inserting the selected aggressor circuit into the circuit model;

incrementing the current model size by a unit size if the sum exceeds the predetermined size, and inserting a virtual attacker model of the selected aggressor circuit into the circuit model;

selecting a next aggressor circuit based on said ordering; and iteratively repeating said determining, said incrementing and inserting, and said selecting a next aggressor circuit.

* * * * *